(12) United States Patent
Bok (10) Patent No.: US 11,735,121 B2
(45) Date of Patent: Aug. 22, 2023

(54) DISPLAY APPARATUS

(71) Applicant: Samsung Display Co., LTD., Yongin-si (KR)

(72) Inventor: Seung-lyong Bok, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/786,068

(22) Filed: Feb. 10, 2020

(65) Prior Publication Data

US 2020/0342816 A1 Oct. 29, 2020

(30) Foreign Application Priority Data

Apr. 29, 2019 (KR) ........................ 10-2019-0049924

(51) Int. Cl.
*G09G 3/3275* (2016.01)
*H10K 59/40* (2023.01)
*G09G 3/32* (2016.01)
*H04M 1/02* (2006.01)
*G09F 9/30* (2006.01)

(52) U.S. Cl.
CPC ............. *G09G 3/3275* (2013.01); *G09G 3/32* (2013.01); *H10K 59/40* (2023.02); *G09F 9/301* (2013.01); *H04M 1/0266* (2013.01)

(58) Field of Classification Search
CPC .......... G09G 3/30; G09G 3/32; G09G 3/3208; G09G 3/3275; H01L 27/32; H01L 27/323; H01L 27/322; H01L 27/3246; H01L 27/3248; H01L 51/524; H01L 51/5221; H01L 51/5206; H01L 51/5218; H10K 59/40; H04M 1/0266; G09F 9/301

USPC ...................................... 345/173, 76, 82, 83
See application file for complete search history.

(56) References Cited

U.S. PATENT DOCUMENTS

| 5,914,853 A * | 6/1999 | Motoe .................. G06F 1/1616 |
| | | 361/679.27 |
| 9,430,180 B2 | 8/2016 | Hirakata et al. |
| 10,395,589 B1 * | 8/2019 | Vahid Far ............ G09G 3/3208 |
| 10,714,554 B2 | 7/2020 | Choo et al. |

(Continued)

FOREIGN PATENT DOCUMENTS

| KR | 1020020048543 A | 6/2002 |
| KR | 1020170085344 A | 7/2017 |

(Continued)

OTHER PUBLICATIONS

Delilah Lin, "Micro LED: Understand the New Display Technology in 3 minutes", www.ledinside.com, Apr. 12, 2017.

(Continued)

*Primary Examiner* — Jimmy H Nguyen
(74) *Attorney, Agent, or Firm* — Cantor Colburn LLP (57) ABSTRACT

A display apparatus includes a display area and a sub-display area. The display area includes a central display area and a plurality of edge display areas. Each of the plurality of edge display areas extends curved from the central display area. The sub-display area is disposed between adjacent edge display areas. Light is emitted at the sub-display area, and the color of the light emitted at the sub-display area is identical or similar to that of light emitted from a portion of the display area adjacent to the sub-display area.

15 Claims, 8 Drawing Sheets

(56) References Cited

U.S. PATENT DOCUMENTS

| | | | | |
|---|---|---|---|---|
| 2013/0258715 A1* | 10/2013 | Osborne | ............... | H05K 1/189 |
| | | | | 362/612 |
| 2016/0234362 A1* | 8/2016 | Moon | ................. | H04M 1/0202 |
| 2017/0205923 A1* | 7/2017 | Shim | .................... | G06F 3/0416 |
| 2017/0236877 A1 | 8/2017 | Jeong | | |
| 2018/0307270 A1* | 10/2018 | Pantel | ................. | H04M 1/0264 |
| 2018/0368270 A1 | 12/2018 | Seo et al. | | |
| 2019/0156757 A1* | 5/2019 | Chang | .................. | H01L 27/156 |
| 2019/0371244 A1* | 12/2019 | Peng | ................... | G09G 3/3266 |

FOREIGN PATENT DOCUMENTS

| | | |
|---|---|---|
| KR | 1020180059634 A | 6/2018 |
| KR | 1020180137644 A | 12/2018 |

OTHER PUBLICATIONS

Kim Ja-Yeon, et al., "Key Technologies and Applications of μLED", The Korean Information Information display, vol. 19, No. 1, pp. 22-32, 2018.

* cited by examiner

DISPLAY APPARATUS

This application claims priority to Korean Patent Application No. 10-2019-0049924 filed on Apr. 29, 2019, and all the benefits accruing therefrom under 35 U.S.C. § 119, the entire contents of which are hereby incorporated by reference.

BACKGROUND

(1) Field

The invention relates to a display apparatus, and more particularly, to a display apparatus with a light emitting module mounted at a corner portion of the display apparatus.

(2) Description of the Related Art

There have been developed a variety of display apparatuses used for multimedia applications such as televisions, mobile phones, navigation systems, computer monitors, and game consoles. The display apparatus includes a display panel for providing a user with an image having certain information and a window member for protecting the display panel.

The window member of the display apparatus occasionally has a curved shape at a lateral edge thereof in order to improve aesthetic impressions of the display apparatus.

SUMMARY

In a display apparatus, since placement of a display panel at a corner portion of a window member is difficult, the corner portion is defined as a bezel area (e.g., non-display area) of the display apparatus, other than a display area thereof. However, the display apparatus having the corner portion as the bezel area deteriorates the aesthetic impression of the display apparatus.

One or more embodiment of the invention provides a display apparatus in which light is emitted at a corner portion of the display apparatus.

According to an embodiment of the invention, a display apparatus may include: a display module which displays an image; and a window member through which the image is transmitted to outside the display apparatus, the window member including: a first transmission portion including a first side, a second side extending from the first side, a first corner at which the first side and the second side meet, a third side extending from the second side and parallel to the first side, and a fourth side extending from the third side and parallel to the second side; a second transmission portion extending curved along a thickness direction of the display apparatus from the first side of the first transmission portion; a third transmission portion extending curved along the thickness direction of the display apparatus from the second side of the first transmission portion; and a first corner transmission portion extending curved along the thickness direction of the display apparatus from the first corner of the first transmission portion, the first corner transmission portion between the second transmission portion and the third transmission portion. The display module includes: a display panel which generates the image, the display panel disposed corresponding to each of the first transmission portion, the second transmission portion and the third transmission portion of the window member; and a first light emitting module corresponding to the first corner transmission portion of the window member.

In embodiments, the window member may further include: a fourth transmission portion extending curved along the thickness direction of the display apparatus from the third side of the first transmission portion; a fifth transmission portion extending curved along the thickness direction of the display apparatus from the fourth side of the first transmission portion; a second corner transmission portion extending curved along the thickness direction of the display apparatus from a second corner of the first transmission portion at which the second side and the third side meet, the second corner transmission portion between the third transmission portion and the fourth transmission portion; a third corner transmission portion extending curved along the thickness direction of the display apparatus from a third corner of the first transmission portion at which the third side and the fourth side meet, the third corner transmission portion between the fourth transmission portion and the fifth transmission portion; and a fourth corner transmission portion extending curved along the thickness direction of the display apparatus from a fourth corner of the first transmission portion at which the fourth side and the first side meet, the fourth corner transmission portion between the second transmission portion and the fifth transmission portion.

In embodiments, the display module may further include the display panel further corresponding to each of the fourth transmission portion and the fifth transmission portion, a second light emitting module corresponding to the second corner transmission portion of the window member; a third light emitting module corresponding to the third corner transmission portion of the window member; and a fourth light emitting module corresponding to the fourth corner transmission portion of the window member.

In embodiments, the display panel may include a first light emitting device including an organic material. The first light emitting module may include a second light emitting device including a semiconductor material.

In embodiments, the first light emitting device may be an organic light emitting device. The second light emitting device may be a micro-light emitting diode (micro-LED).

In embodiments, the display apparatus may further include a support member on which the display panel is supported, the support member facing the window member with both the display panel and the first light emitting module therebetween.

In embodiments, at the first corner transmission portion of the window member, the first light emitting module may be fixed to the support member.

In embodiments, at the first corner transmission portion of the window member, the first light emitting module may be fixed to the window member.

In embodiments, the display module may further include an input detection sensor with which an external touch is detected. The input detection sensor may correspond to the display panel and may not correspond to the first light emitting module.

In embodiments, the display module may further include: a first data driver circuit which provides a first data signal to the display panel; a second data driver circuit which provides a second data signal to the first light emitting module; and a control circuit which controls the first data driver circuit and the second data driver circuit. In embodiments, the control circuit may control the first and second data signals to be dependent on each other.

In embodiments, the first light emitting module may emit a light having a first color. An area of the display panel may be disposed adjacent to the first light emitting module and may emit a light having a color substantially the same as the first color.

According to an embodiment of the invention embodiments, a display apparatus includes a first display area including a first side, a second side extending from the first side, a first corner at which the first side and the second side meet, a third side extending from the second side and parallel to the first side, and a fourth side extending from the third side and parallel to the second side; a second display area extending curved along a thickness direction of the display apparatus from the first side of the first display area; a third display area extending curved along the thickness direction of the display apparatus from the second side of the first display area, a first sub-display area extending curved along the thickness direction of the display apparatus from the first corner of the first display area, the first sub-display area between the second display area and the third display area; and a first boundary defined between the first sub-display area and the second display area and between the first sub-display area and the third display area, the first boundary having a color.

In embodiments, the display apparatus may further include: a fourth display area extending curved along the thickness direction of the display apparatus from the third side of the first display area; a fifth display area extending curved along the thickness direction of the display apparatus from the fourth side of the first display area; a second sub-display area extending curved along the thickness direction of the display apparatus from a second corner of the first display area at which the second side and the third side meet, the second sub-display area between the third display area and the fourth display area; a third sub-display area extending curved along the thickness direction of the display apparatus from a third corner of the first display area at which the third side and the fourth side meet, the third sub-display area between the fourth display area and the fifth display area; and a fourth sub-display area extending curved along the thickness direction of the display apparatus from a fourth corner of the first display area at which the fourth side and the first side meet, the fourth sub-display area between the second display area and the fifth display area.

In embodiments, the display apparatus may further include: a second boundary defined between the second sub-display area and the third display area and between the second sub-display area and the fourth display area, the second boundary having a color; a third boundary defined between the third sub-display area and the fourth display area and between the third sub-display area and the fifth display area, the third boundary having a color; and a fourth boundary defined between the fourth sub-display area and the second display area and between the fourth sub-display area and the fifth display area, the fourth boundary having a color.

In embodiments, the display apparatus may further include a display module including: a display panel corresponding to the first display area, the second display area and the third display area; and a light emitting module adjacent to the display panel and corresponding to the first sub-display area.

In embodiments, the display panel may include a first light emitting device including an organic material. The light emitting module may include a second light emitting device including a semiconductor material.

In embodiments, the display apparatus may further include: a window member corresponding to the display panel; and a support member on which the display panel is supported, the support member facing the window member with both the display panel and the light emitting module therebetween.

In embodiments, at the first sub-display area, the light emitting module may be fixed to the support member.

In embodiments, at the first sub-display area, the light emitting module may be fixed to the window member.

BRIEF DESCRIPTION OF THE DRAWINGS

The above and other advantages and features of this disclosure will become more apparent by describing in further detail embodiments thereof with reference to the accompanying drawings, in which.

DETAILED DESCRIPTION

The following will now describe embodiments of the invention in conjunction with the accompanying drawings. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being related to another element such as being "on" another element, it can be directly on the other element or intervening elements may be present therebetween. In contrast, when an element is referred to as being related to another element such as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

In the drawings, thicknesses of layers and areas are exaggerated for effectively explaining the technical contents. The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an."

"Or" means "and/or." The term "and/or" includes one or more combinations defined by associated components.

It should be understood that the terms "comprise," "include," "have,", and the like are used to specify the presence of stated features, integers, steps, operations, components, elements, or combinations thereof, but do not preclude the presence or addition of one or more other features, integers, steps, operations, components, elements, or combinations thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Figure 1A:
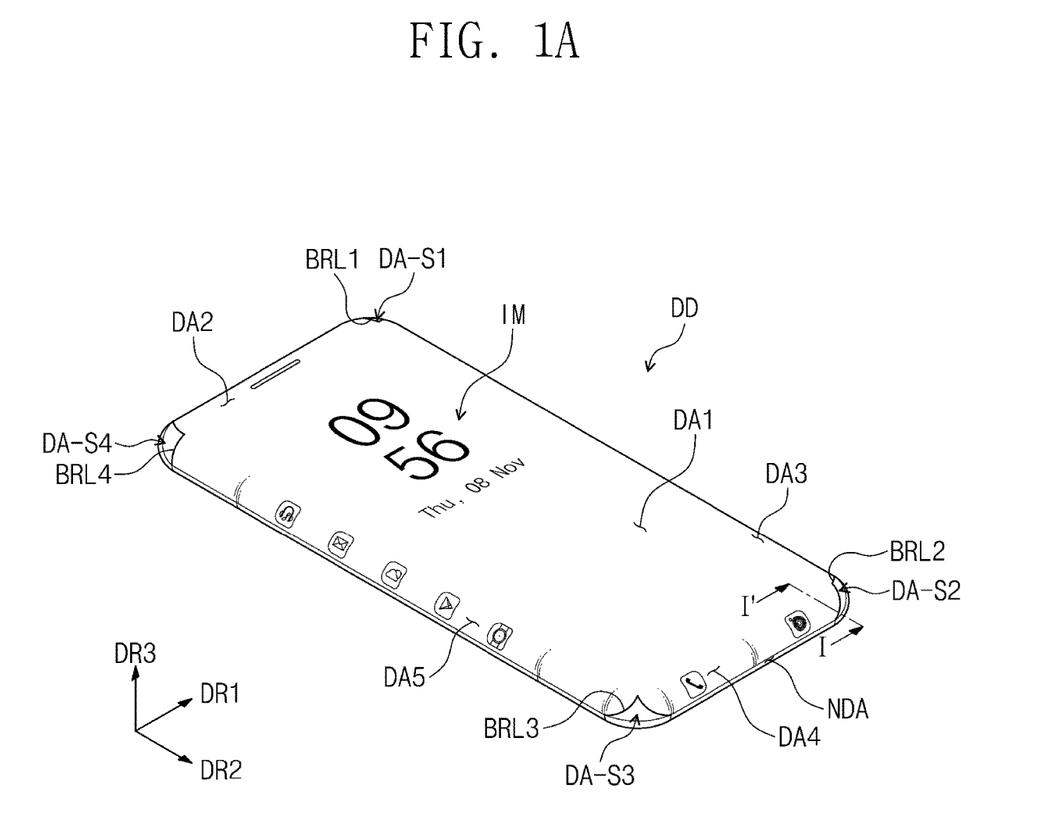
FIG. 1A is a perspective view showing an embodiment of a display apparatus.
Figure 1B:
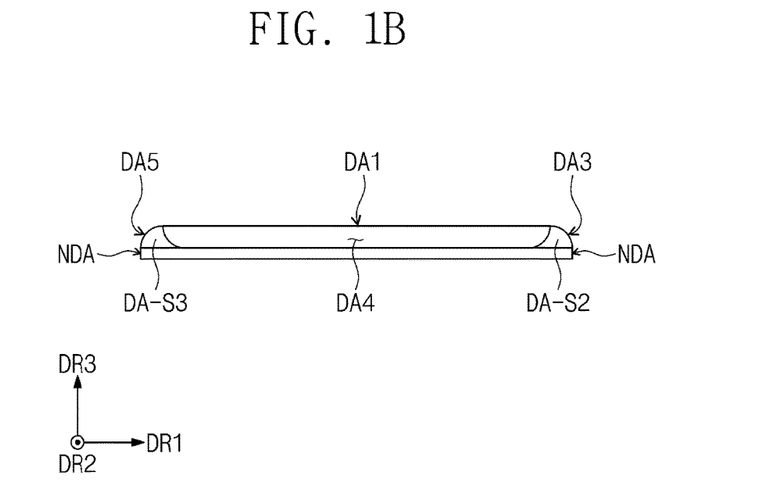
FIGS. 1B and 1C are cross-sectional side views showing the display apparatus of FIG. 1A.
Figure 1C:
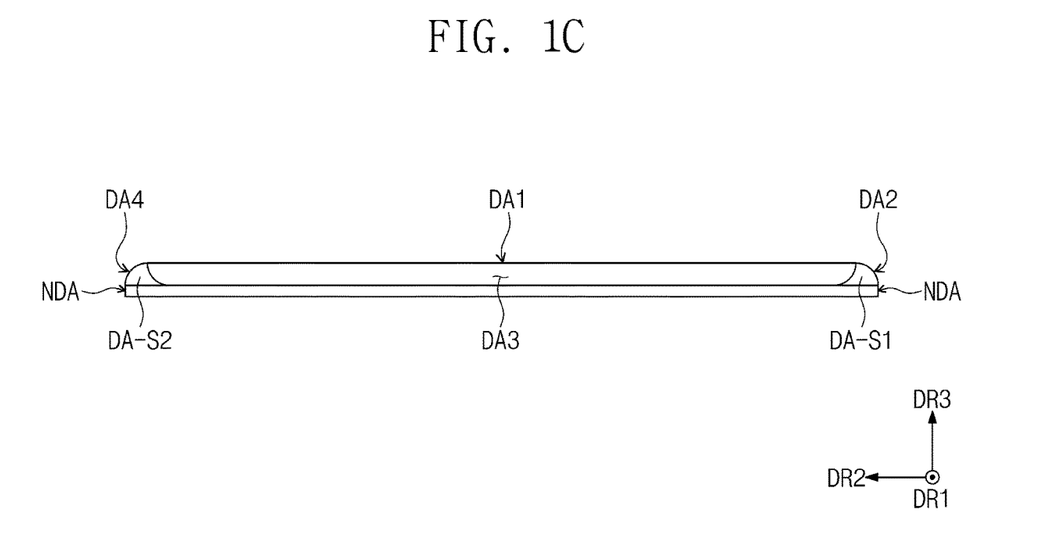

FIG. 1A is a perspective view showing an embodiment of a display apparatus DD. FIGS. 1B and 1C are cross-sectional side views showing the display apparatus DD of FIG. 1A.

FIGS. 1A to 1C exemplarily show a smart phone as an example of the display apparatus DD. The invention, however, is not limited thereto. The display apparatus DD may be applicable not only to relatively large-sized electronic products such as television sets and monitors, but to relatively small-sized and middle-sized electronic products such as portable phones, tablet personal computers ("PCs"), automotive navigation systems, game consoles, and smart watches.

The display apparatus DD may include a display area collectively including a plurality of display regions (e.g., display areas DA1, DA2, DA3, DA4, and DA5 or display areas DA1 to DA5) which displays an image IM, a sub-display area collectively including a plurality of sub-display regions (e.g., sub-display areas DA-S1, DA-S2, DA-S3, and DA-S4 or sub-display areas DA-S1 to DA-S4) which emits light, a boundary collectively including a plurality of boundaries (e.g., boundaries BRL1, BRL2, BRL3, and BRL4) which is respectively between the display areas DA1 to DA5 and the sub-display areas DA-S1 to DA-S4, and a non-display area NDA. FIG. 1A shows a clock and an icon image as examples of the image IM.

The non-display area NDA is a zone or region at which the image IM is not displayed. The non-display area NDA may define a bezel area of the display apparatus DD.

The non-display area NDA may be adjacent to the display areas DA1 to DA5 and the sub-display areas DA-S1 to DA-S4. In an embodiment, the non-display area NDA may surround the display areas DA1 to DA5 and the sub-display areas DA-S1 to DA-S4 The invention, however, is not limited thereto. In another embodiment, for example, the non-display area NDA may have a shape which is designed to conform to that of the display area DA1 to DA5 and that of the sub-display areas DA-S1 to DA-S4.

The display areas DA1 to DA5 may include a first display area DA1, a second display area DA2, a third display area DA3, a fourth display area DA4, and a fifth display area DA5.

The first display area DA1 (e.g., a central display area DA1) is disposed in a plane which is parallel to a plane defined by a first direction DR1 and a second direction DR2 which cross each other. A third direction DR3 indicates a normal direction of the first display area DA1, or a thickness direction of the display apparatus DD. The third direction DR3 differentiates a front surface (or top surface) and a rear surface (or bottom surface) of each member. However, directions expressed by the first, second, and third directions DR1, DR2, and DR3 are relative concepts and may thus denote other directions. First, second, and third directions are defined hereinafter to refer to directions respectively indicated by the first, second, and third directions DR1, DR2, and DR3, and are allocated the same reference symbols thereto.

The second display area DA2 may be adjacent to and extend along a first edge or side of the first display area DA1. The third display area DA3 may be adjacent to and extend along a second edge or side of the first display area DA1. The fourth display area DA4 may be adjacent to and extend along a third edge or side of the first display area DA1. The fifth display area DA5 may be adjacent to and extend along a fourth edge or side of the first display area DA1.

The first display area DA1 may include or define a first side lengthwise extending along a direction parallel to the first direction DR1, a second side lengthwise extending from the first side and along a direction parallel to the second direction DR2, a third side lengthwise extending from the second side and along the direction parallel to the first direction DR1, and a fourth side lengthwise extending from the third side and along the direction parallel to the second direction DR2. The first side and the third side may be parallel to each other, and the second side and the fourth side may be parallel to each other. Corners of the first display area DA1 may include a first corner at which the first side and the second side meet each other, a second corner at which the second side and the third side meet each other, a third corner at which the third side and the fourth side meet each other, and a fourth corner at which the fourth side and the first side meet each other.

Each of the second, third, fourth, and fifth display areas DA2, DA3, DA4, and DA5 (e.g., edge display areas DA2, DA3, DA4, and DA5) may be bent to have a curvature along the third direction DR3. The first display area DA1 may extend bent along the third direction DR3 from the plane defined by the first direction DR1 and the second direction DR2 which cross each other, to define an extended portion of the first display area DA1 as the second, third, fourth, and fifth display areas DA2, DA3, DA4, and DA5. Each of the second, third, fourth, and fifth display areas DA2, DA3, DA4, and DA5 may extend along a side of the display apparatus DD, such as along the first direction DR1 or along the second direction DR2.

The sub-display areas DA-S1 to DA-S4 may include a first sub-display area DA-S1, a second sub-display area DA-S2, a third sub-display area DA-S3, and a fourth sub-display area DA-S4.

The first sub-display area DA-S1 may be disposed between the second display area DA2 and the third display area DA3, and may connect the second display area DA2 and the third display area DA3 to each other. The second sub-display area DA-S2 may be disposed between the third display area DA3 and the fourth display area DA4, and may connect the third display area DA3 and the fourth display area DA4 to each other. The third sub-display area DA-S3 may be disposed between the fourth display area DA4 and the fifth display area DA5, and may connect the fourth display area DA4 and the fifth display area DA5 to each other. The fourth sub-display area DA-S4 may be disposed between the second display area DA2 and the fifth display area DA5, and may connect the second display area DA2 and the fifth display area DA5 to each other. Along an outer edge of the display apparatus DD which is defined along the first direction DR1 and the second direction DR2 shown in FIG. 1A, the various sub-display areas may between various display areas as described above.

Each of the first, second, third, and fourth sub-display areas DA-S1, DA-S2, DA-S3, and DA-S4 may be bent to have a curvature along the third direction DR3. The first display area DA1 may further extend bent along the third direction DR3 from the plane defined by the first direction DR1 and the second direction DR2 which cross each other, to define a corner extended portion of the first display area DA1 as the first, second, third, and fourth sub-display areas DA-S1, DA-S2, DA-S3, and DA-S4. Each of the first, second, third, and fourth sub-display areas DA-S1, DA-S2, DA-S3, and DA-S4 may be respectively disposed at a corner of the display apparatus DD among a plurality of corners.

One or more regions among regions of the sub-display areas DA-S1 to DA-S4 may emit light whose color is identical or similar to that of light emitted from one or more regions among regions of the display areas DA1 to DA5 which respectively adjacent to the one or more regions among regions of the sub-display areas DA-S1 to DA-S4. In an embodiment, for example, the third sub-display area DA-S3 may emit light whose color is substantially the same as that of light emitted from an adjacent region among the first, fourth, and fifth display areas DA1, DA4, and DA5 which are each adjacent to the third sub-display area DA-S3.

A first image displayed on the display areas DA1 to DA5 and a second image displayed on the sub-display areas DA-S1 to DA-S4 may be dependent on or related to each other. In an embodiment, for example, the first image and the second image may be combined with each other to develop a collective picture, a movie scene, or a user interface/user experience ("UI/UX") design.

Since the display areas DA1 to DA5 and the sub-display areas DA-S1 to DA-S4 each display an image and are visible from outside the display apparatus DD, such as along the normal direction of the first display area DA1 the non-display area NDA which is recognizable from outside the display apparatus DD may be minimized. The second to fifth display areas DA2 to DA5 and the first to fourth sub-display areas DA-S1 to DA-S4 that are extended bent from the first display area DA1 to have curvatures along the third direction DR3, may improve aesthetic impressions of the display apparatus DD, and recognition of the non-display area NDA may be minimized.

The boundary BRL1 to BRL4 may include a first boundary BRL1, a second boundary BRL2, a third boundary BRL3, and a fourth boundary BRL4.

The first boundary BRL1 may be disposed between the first sub-display area DA-S1 and the second display area DA2 and between the first sub-display area DA-S1 and the third display area DA3. The second boundary BRL2 may be disposed between the second sub-display area DA-S2 and the third display area DA3 and between the second sub-display area DA-S2 and the fourth display area DA4. The third boundary BRL3 may be disposed between the third sub-display area DA-S3 and the fourth display area DA4 and between the third sub-display area DA-S3 and the fifth display area DA5. The fourth boundary BRL4 may be disposed between the fourth sub-display area DA-S4 and the second display area DA2 and between the fourth sub-display area DA-S4 and the fifth display area DA5.

A component or structure which provides light to the first to fifth display areas DA1 to DA5 may be different from that that which provides light to the sub-display areas DA-S1 to DA-S4, and thus the boundary BRL1 to BRL4 respectively between the display areas DA1 to DA5 and the sub-display areas DA-S1 to DA-S4 may be recognized. The boundary BRL1 to BRL4 may have a constant color, for example, a color identical or similar to that of the non-display area NDA.

Figure 2:
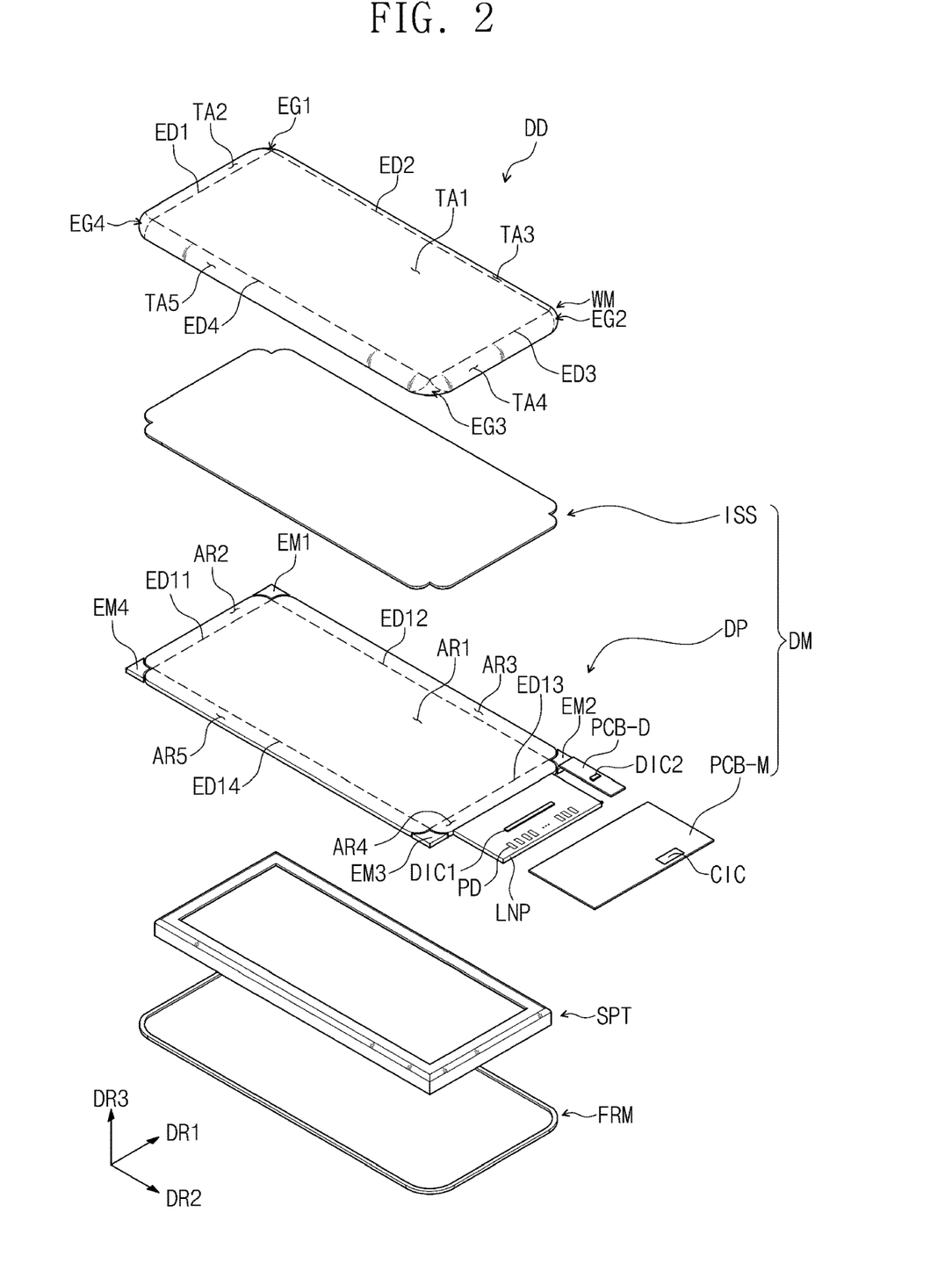
FIG. 2 is an exploded perspective view showing an embodiment of a display apparatus.

FIG. 2 is an exploded perspective view showing an embodiment of the display apparatus DD.

The display apparatus DD may include a window member WM, a display module DM, a support member SPT, and a frame FRM.

The window member WM may be disposed above the display module DM. The window member WM may protect the display module DM against external impact or the like.

The window member WM may include a transparent material. In an embodiment, for example, the window member WM may include glass or transparent synthetic resin.

The window member WM may include transmission portions TA1, TA2, TA3, TA4, and TA5 (e.g., transmission portions TA1 to TA5) at which the image IM is displayed and visible to outside the display apparatus DD, and corner portions EG1, EG2, EG3, and EG4 (e.g., corner portions EG1 to EG4 or corner transmission portions EG1 to EG4) at which light is emitted through the window member WM to outside the display apparatus DD. The transmission portions TA1, TA2, TA3, TA4, and TA5 and the corner portions EG1, EG2, EG3, and EG4 of the window member WM may respectively correspond to the display areas DA1, DA2, DA3, DA4, and DA5 and the sub-display areas DA-S1, DA-S2, DA-S3, and DA-S4 of the display apparatus DD.

The transmission portions TA1 to TA5 may include a first transmission portion TA1, a second transmission portion TA2, a third transmission portion TA3, a fourth transmission portion TA4, and a fifth transmission portion TA5.

The first transmission portion TA1 is disposed in a plane which is parallel to a plane defined by the first direction DR1 and the second direction DR2 which cross each other. The first transmission portion TA1 may include or define a first edge ED1 (or side ED1) lengthwise extending along a direction parallel to the first direction DR1, a second edge ED2 (or side ED2) lengthwise extending from the first edge ED1 and along a direction parallel to the second direction DR2, a third edge ED3 (or side ED3) lengthwise extending from the second edge ED2 and along the direction parallel to the first direction DR1, and a fourth edge ED4 (or side ED4) lengthwise extending from the third edge ED3 and along the direction parallel to the second direction DR2. The first edge ED1 and the third edge ED3 may be parallel to each other, and the second edge ED2 and the fourth edge ED4 may be parallel to each other. Corners of the first transmission portion TA1 may include a first corner at which the first edge ED1 and the second edge ED2 meet each other, a second corner at which the second edge ED2 and the third edge ED3 meet each other, a third corner at which the third edge ED3 and the fourth edge ED4 meet each other, and a fourth corner at which the fourth edge ED4 and the first edge ED1 meet each other.

The second transmission portion TA2 may extend along the first edge ED1 of the first transmission portion TA1. The third transmission portion TA3 may extend along the second edge ED2 of the first transmission portion TA1. The fourth transmission portion TA4 may extend along the third edge ED3 of the first transmission portion TA1. The fifth transmission portion TA5 may extend along the fourth edge ED4 of the first transmission portion TA1.

Each of the second, third, fourth, and fifth transmission portions TA2, TA3, TA4, and TA5 may be bent to have a curvature along the third direction DR3. The first transmission portion TA1 may extend bent along the third direction DR3 from the plane defined by the first direction DR1 and the second direction DR2 which cross each other, to define an extended portion of the first transmission portion TA1, as the second, third, fourth, and fifth transmission portions TA2, TA3, TA4, and TA5. Each of the second, third, fourth, and fifth transmission portions TA2, TA3, TA4, and TA5 may extend along a side of the display apparatus DD, such as along the first direction DR1 or along the second direction DR2.

The corner portions EG1 to EG4 may include a first corner portion EG1 (e.g., first corner transmission portion EG1), a second corner portion EG2 (e.g., second corner transmission portion EG2), a third corner portion EG3 (e.g., third corner transmission portion EG3), and a fourth corner portion EG4 (e.g., fourth corner transmission portion EG4).

The first corner portion EG1 may be disposed between the second transmission portion TA2 and the third transmission portion TA3, and may connect the second transmission portion TA2 and the third transmission portion TA3 to each other. The second corner portion EG2 may be disposed between the third transmission portion TA3 and the fourth transmission portion TA4, and may connect the third transmission portion TA3 and the fourth transmission portion TA4 to each other. The third corner portion EG3 may be disposed between the fourth transmission portion TA4 and the fifth transmission portion TA5, and may connect the fourth transmission portion TA4 and the fifth transmission portion TA5 to each other. The fourth corner portion EG4 may be disposed between the second transmission portion TA2 and the fifth transmission portion TA5, and may connect the second transmission portion TA2 and the fifth transmission portion TA5 to each other. Along an outer edge of the display apparatus DD which is defined along the first direction DR1 and the second direction DR2 shown in FIG. 1A, the various corner portions may between various transmission portions as described above.

Each of the first, second, third, and fourth corner portions EG1, EG2, EG3, and EG4 may be bent to have a curvature along the third direction DR3. The first transmission portion TA1 may further extend bent along the third direction DR3 from the plane defined by the first direction DR1 and the second direction DR2 which cross each other, to define a corner transmission extended portion of the first transmission portion TA1, as the first, second, third, and fourth corner portions EG1, EG2, EG3, and EG4. Each of the first, second, third, and fourth corner portions EG1, EG2, EG3, and EG4 may be respectively disposed at a corner of the display apparatus DD among a plurality of corners thereof.

The display module DM may include a display panel DP, light emitting modules EM1, EM2, EM3, and EM4 (e.g., light emitting modules EM1 to EM4), printed circuit boards PCB-D and PCB-M, data driver circuits DIC1 and DIC2, a control circuit CIC, and input detection sensor ISS (e.g., input detection member ISS).

The display panel DP may be a component which generates light and/or an image IM (see FIG. 1A).

The display panel DP may include a first area AR1, a second area AR2, a third area AR3, a fourth area AR4, and fifth area AR5.

The first area AR1 may correspond to and provide light to the first transmission portion TA1. The second area AR2 may correspond to and provide light to the second transmission portion TA2. The third area AR3 may correspond to and provide light to the third transmission portion TA3. The fourth area AR4 may correspond to and provide light to the fourth transmission portion TA4. The fifth area AR5 may correspond to and provide light to the fifth transmission portion TA5.

The first area AR1 is disposed in a plane which is parallel to a plane defined by the first direction DR1 and the second direction DR2 which cross each other. The first area AR1 may include or define a first edge ED11 lengthwise extending along the direction parallel to the first direction DR1, a second edge ED12 lengthwise extending from the first edge ED11 and along the direction parallel to the second direction DR2, a third edge ED13 lengthwise extending from the second edge ED12 and along the direction parallel to the first direction DR1, and a fourth edge ED14 lengthwise extending from the third edge ED13 and along in the direction parallel to the second direction DR2. The first edge ED11 and the third edge ED13 may be parallel to each other, and the second edge ED12 and the fourth edge ED14 may be parallel to each other.

The second area AR2 may extend along the first edge ED11 of the first area AR1. The third area AR3 may extend along on the second edge ED12 of the first area AR1. The fourth area AR4 may extend along the third edge ED13 of the first area AR1. The fifth area AR5 may extend along the fourth edge ED14 of the first area AR1.

The second to fifth areas AR2 to AR5 may be bent at curvatures along the third direction DR3 from the first area AR1 to respectively correspond to the second to fifth transmission portions TA2 to TA5 of the window member WM.

The light emitting modules EM1 to EM4 may include a first light emitting module EM1, a second light emitting module EM2, a third light emitting module EM3, and a fourth light emitting module EM4.

The first light emitting module EM1 may be disposed between the second area AR2 and the third area AR3. The second light emitting module EM2 may be disposed between the third area AR3 and the fourth area AR4. The third light emitting module EM3 may be disposed between the fourth area AR4 and the fifth area AR5. The fourth light emitting module EM4 may be disposed between the second area AR2 and the fifth area AR5. Along an outer edge of the display apparatus DD which is defined along the first direction DR1 and the second direction DR2 shown in FIG. 1A, the various light emitting modules may between various areas as described above.

The first light emitting module EM1 may provide light to the first corner portion EG1. The second light emitting module EM2 may provide light to the second corner portion EG2. The third light emitting module EM3 may provide light to the third corner portion EG3. The fourth light emitting module EM4 may provide light to the fourth corner portion EG4.

The light emitting modules EM1 to EM4 may be bent along the third direction DR3 from the first area AR1 to correspond to the corner portions EG1 to EG4 of the window member WM.

The input detection sensor ISS may be disposed on the display panel DP. The input detection sensor ISS may be directly placed on the display panel DP or may be attached through an adhesive member (not shown) to the display panel DP.

The input detection sensor ISS may include a plurality of sensors (not shown). Each of the sensors may be capacitively-coupled to other sensors. When a touch or force is provided at the display areas DA1 to DA5, the display apparatus DD may detect a variation in capacitance between the sensors, and may determine the presence or absence of the touch or force and a location thereof.

The input detection sensor ISS may not be disposed on or may not correspond to the light emitting modules EM1, EM2, EM3, and EM4. The input detection sensor ISS corresponds to the display panel DP and terminates at the light emitting modules EM1, EM2, EM3, and EM4 such that the input detection sensor ISS does not correspond to the light emitting modules EM1, EM2, EM3, and EM4. That is, display apparatus DD may detect a touch or force at the display areas DA1 to DA5, but not at the sub-display areas DA-S1 to DA-S4.

The display panel DP may further include a connection line portion LNP extending from the fourth area AR4. A first data driver circuit DIC1 and pads PD may be mounted on the connection line portion LNP of the display panel DP. The first data driver circuit DIC1 and the pads PD may be electrically connected to the display areas DA1 to DA5 of the display panel DP.

The first data driver circuit DIC1 may provide a first data signal to the display areas DA1 to DA5 of the display panel DP.

The display panel DP may be electrically connected through the pads PD to a main printed circuit board PCB-M disposed external to the display panel DP. An external signal may be provided from the main printed circuit board PCB-M to the display area DA1 to DA5 of the display panel DP, via the pads PD and/or the first data driver circuit DIC1.

Each of the light emitting modules EM1 to EM4 may be electrically connected to a data printed circuit board PCB-D disposed external to the display panel DP. FIG. 2 exemplarily shows that the second light emitting module EM2 among the light emitting modules EM1 to EM4 is electrically connected to the data printed circuit board PCB-D, but the invention is not limited thereto. In embodiments, the data printed circuit board PCB-D may be provided in plural (e.g., plurality of data printed circuit boards PCB-D), and the plurality of data printed circuit boards PCB-D may be respectively electrically connected to corresponding light emitting modules EM1 to EM4. In other embodiments, the light emitting modules EM1 to EM4 may all be electrically connected to a same one data printed circuit board PCB-D.

In embodiments, the data printed circuit board PCB-D may be replaced by a portion of the display panel DP. In an embodiment, for example, a portion (e.g., the connection line portion LNP) of the display panel DP may extend to have electrical connection with the light emitting modules EM1 to EM4. In such cases, the display module DM may omit second data drive circuit DIC2 which will be discussed below, and the first data driver circuit DIC1 may provide respective signals (e.g., a driving signal, a control signal, a power signal, a data signal, etc.) to both the display panel DP and the light emitting modules EM1 to EM4.

The second data driver circuit DIC2 may be mounted on the data printed circuit board PCB-D. The second data driver circuit DIC2 may provide a second data signal to the light emitting modules EM1 to EM4. In embodiments, the first and second data signals respectively of the first and second data driver circuits DIC1 and DIC2, may be dependent on each other.

The main printed circuit board PCB-M may be electrically connected to the data printed circuit board PCB-D and the pads PD of the display panel DP. In an embodiment, a same one main printed circuit board PCB-M may be electrically connected to the data printed circuit board PCB-D and the pads PD of the display panel DP.

The control circuit CIC may be mounted on the main printed circuit board PCB-M. The control circuit CIC may control the first and second data driver circuits DIC1 and DIC2. The control circuit CIC may control the first and second data driver circuits DIC1 and DIC2 to drive dependently on each other. The control circuit CIC may determine a color of light emitted from each of the display panel DP and the light emitting modules EM1 to EM4.

The support member SPT may be disposed below the display module DM. The support member SPT may support one or more component of the display module DM.

The frame FRM may be disposed below the support member SPT. The frame FRM may accommodate the support member SPT, the display module DM, and a portion of the window member WM within the frame FRM.

In embodiments, the frame FRM may be coupled to the window member WM.

Figure 3:
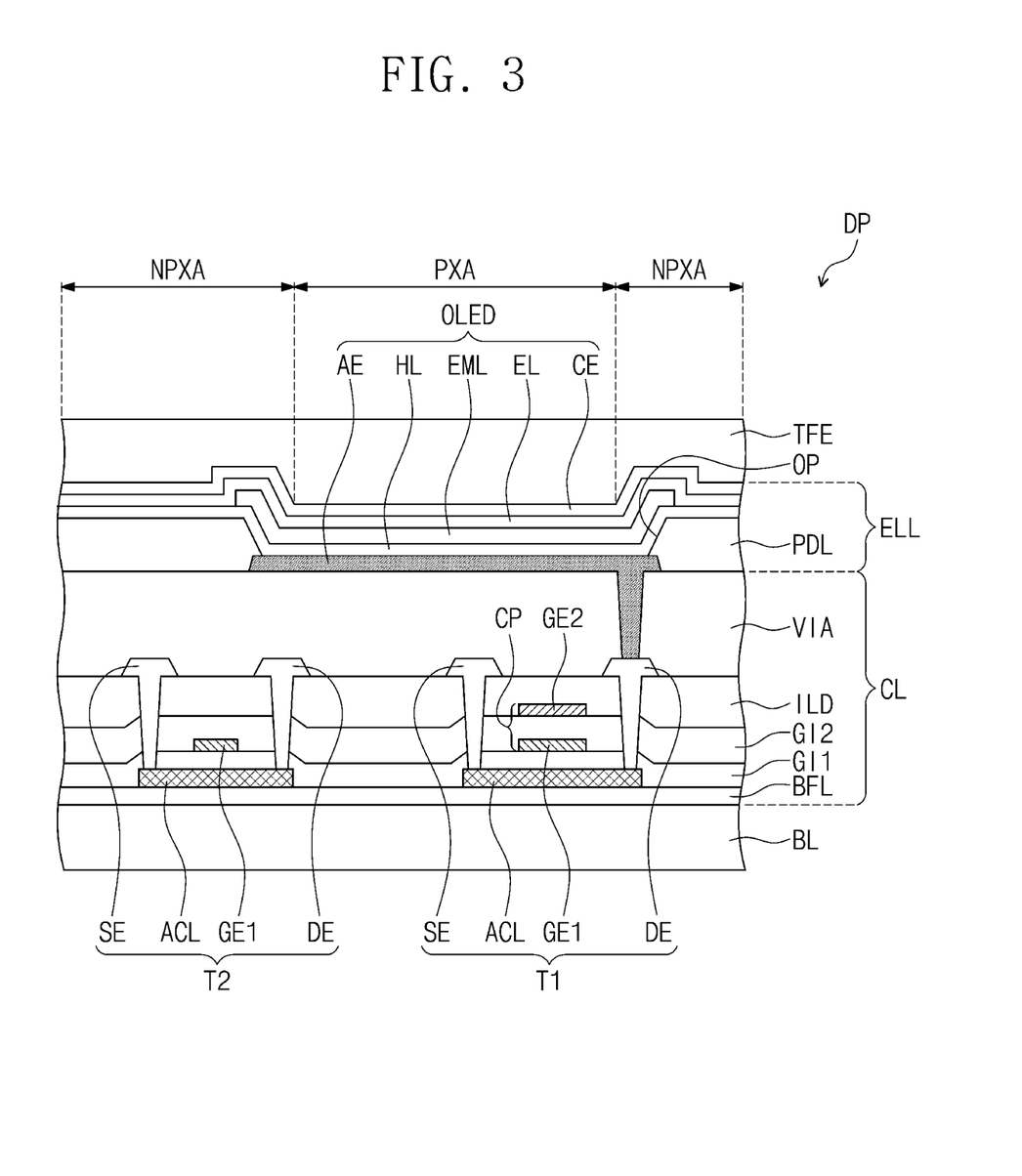
FIG. 3 is an enlarged cross-sectional view showing an embodiment of a display panel.

FIG. 3 is an enlarged cross-sectional view showing an embodiment of the display panel DP.

The display panel DP may include a base layer BL, a circuit layer CL, a light emitting device layer ELL, and an encapsulation layer TFE.

The circuit layer CL may include a buffer layer BFL, gate dielectric layers GI1 and GI2, an interlayer dielectric layer ILD, a circuit dielectric layer VIA, and transistors T1 and T2. The buffer layer BFL, the gate dielectric layers GI1 and GI2, the interlayer dielectric layer ILD, and the circuit dielectric layer VIA may each include an organic material or an inorganic material. Each of the transistors T1 and T2 may include a gate electrode GE1, an active layer ACL, a source electrode SE and a drain electrode DE, without being limited thereto.

The light emitting device layer ELL may include an organic light emitting device OLED (or a first light emitting device OLED) and a pixel definition layer PDL. The organic light emitting device OLED may include an anode electrode AE, a hole control layer HL, a light emitting layer EML, an electron control layer EL, and a cathode electrode CE.

The pixel definition layer PDL may define an opening OP which exposes the anode electrode AE of the organic light emitting device OLED.

The encapsulation layer TFE may encapsulate and protect the light emitting device layer ELL from external oxygen or moisture. The encapsulation layer TFE may be a layer in which organic and inorganic layers are disposed in combination.

In this description, a pixel area PXA may be defined to refer to an area from which is externally emitted a light that is generated from the organic light emitting device OLED, and a non-pixel area NPXA may be defined to refer to an area other than the pixel area PXA. The pixel area PXA may correspond to various areas among the first to fifth display areas DA1 to DA5 discussed above.

FIG. 3 exemplarily shows the organic light emitting device OLED, but in other embodiments, the organic light emitting device OLED may be replaced with other types of light emitting devices.

Figure 4:
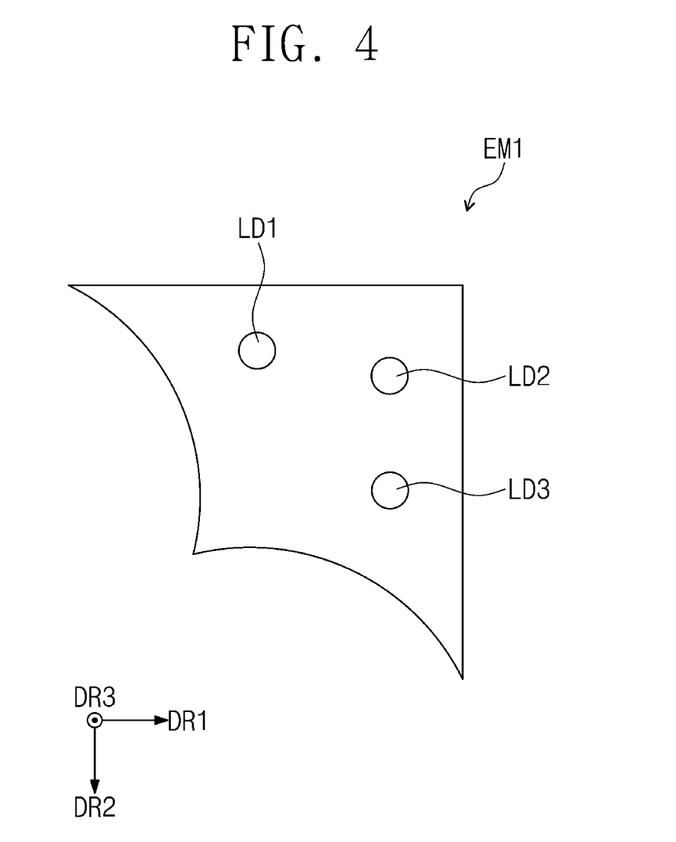
FIGS. 4 and 5 are top plan views showing embodiments of a light emitting module.
Figure 5:
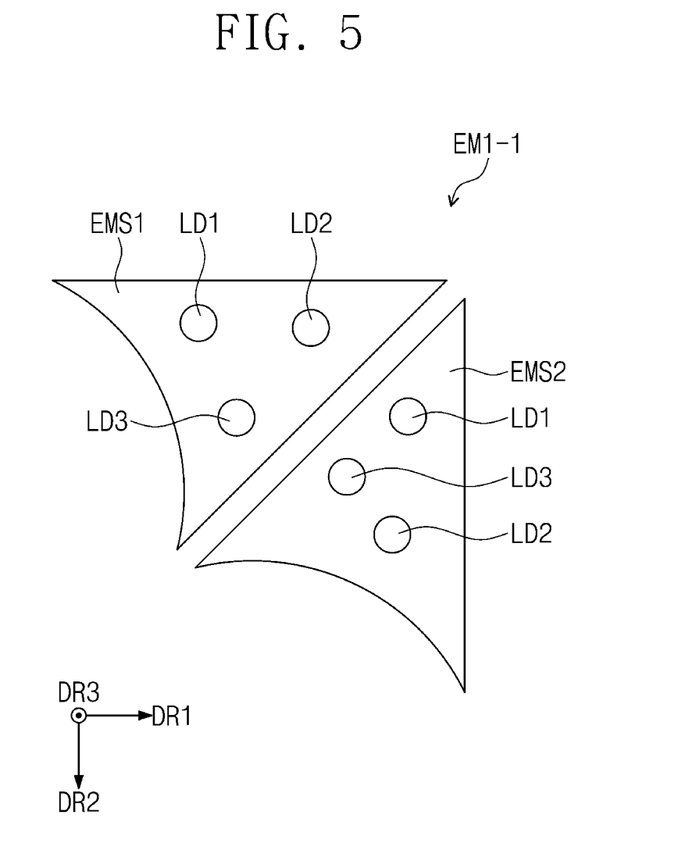

FIGS. 4 and 5 are top plan views showing embodiments of a first light emitting module EM1. FIG. 4 exemplarily shows the first light emitting module EM1 illustrated in FIG. 2, and FIG. 5 exemplarily shows a modified embodiment of a first light emitting module EM1-1.

Referring to FIG. 4, the first light emitting module EM1 may include a plurality of light emitting devices LD1, LD2, and LD3 (or second light emitting devices LD1, LD2, and LD3). FIG. 4 exemplarily shows a total of three light emitting devices LD1, LD2, and LD3, but the invention are not limited thereto. In embodiments, the number of light emitting devices included in the first light emitting module EM1 may be less or greater than 3.

The light emitting devices LD1, LD2, and LD3 may include a first color light emitting device LD1, a second color light emitting device LD2, and a third color light emitting device LD3. In embodiments, the first color light emitting device LD1 may emit a red-colored light, the second color light emitting device LD2 may emit a green-colored light, and the third color light emitting device LD3 may emit a blue-colored light. That is, the light emitting devices LD1, LD2, and LD3 may respectively generate and/or emit lights of different colors from each other.

Each of the light emitting devices LD1 to LD3 may include a semiconductor material. In an embodiment, for example, each of the light emitting devices LD1 to LD3 may include a light emitting portion consisting of a semiconductor material. Each of the light emitting devices LD1 to LD3 may be a light emitting diode ("LED") or a micro-light emitting diode (micro-LED).

The description of the first light emitting module EM1 is substantially identically applicable to the second, third, and fourth light emitting modules EM2, EM3, and EM4.

Referring to FIG. 5, the first light emitting module EM1-1 may include a first sub-light emitting module EMS1 and a second sub-light emitting module EMS2. Each of the first and second sub-light emitting modules EMS1 and EMS2 may include light emitting devices LD1, LD2, and LD3.

The first and second sub-light emitting modules EMS1 and EMS2 may be spaced apart from each other, and thus the first light emitting module EM1-1 may be easily attached to the first corner portion EG1 of the window member WM, such as to conform to the curvature of the window member WM at the first corner portion EG1.

The description of the first light emitting module EM1-1 is substantially identically applicable to the second, third, and fourth light emitting modules EM2, EM3, and EM4.

Figure 6:
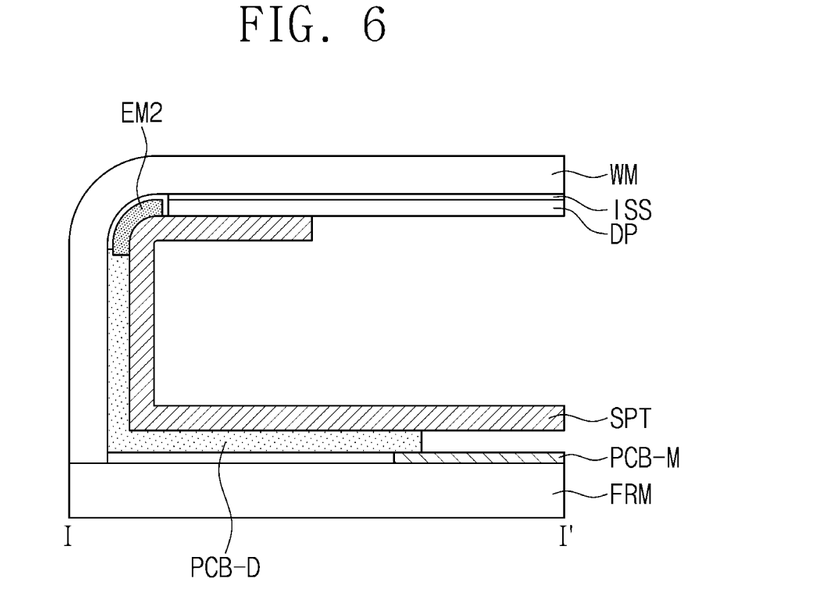
FIGS. 6 and 7 are enlarged cross-sectional views taken along line I-I' of FIG. 1A.
Figure 7:
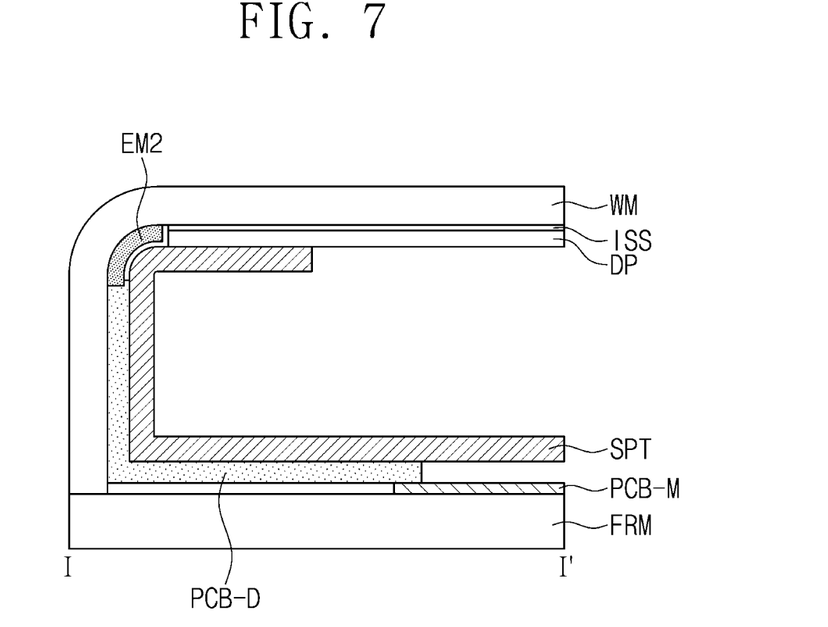

FIGS. 6 and 7 are enlarged cross-sectional views taken along line I-I' of FIG. 1A. FIGS. 6 and 7 each show an enlarged cross-sectional view of an embodiment of the second light emitting module EM2 and a corresponding portion of the display apparatus DD.

Referring to FIG. 6, the second light emitting module EM2 may be fixed to the support member SPT. In embodiments, the second light emitting module EM2 may be attached through an adhesive member (not shown) to one surface of the support member SPT. The second light emitting module EM2 may be spaced apart from the window member WM.

Although not shown, the light emitting modules EM1, EM3, and EM4 other than the second light emitting module EM2 may also be fixed to the support member SPT as described above for the structure in FIG. 6.

The display apparatus DD which is assembled (refer to FIGS. 1A, 1B, 1C and 2) may dispose the data printed circuit board PCB-D bent along the support member SPT at an outer surface thereof. The second light emitting module EM2 may be fixed to the support member SPT at the outer surface thereof.

Referring to FIG. 7, the second light emitting module EM2 may be fixed to the window member WM. In embodiments, the second light emitting module EM2 may be attached to an inner surface of the window member WM through a transparent adhesive member (e.g., an optical clear adhesive or an optical clear resin). The second light emitting module EM2 may be spaced apart from the support member SPT.

Although not shown, the light emitting modules EM1, EM3, and EM4 other than the second light emitting module EM2 may also be fixed to the window member WM as described above for the structure in FIG. 7.

Figure 8:
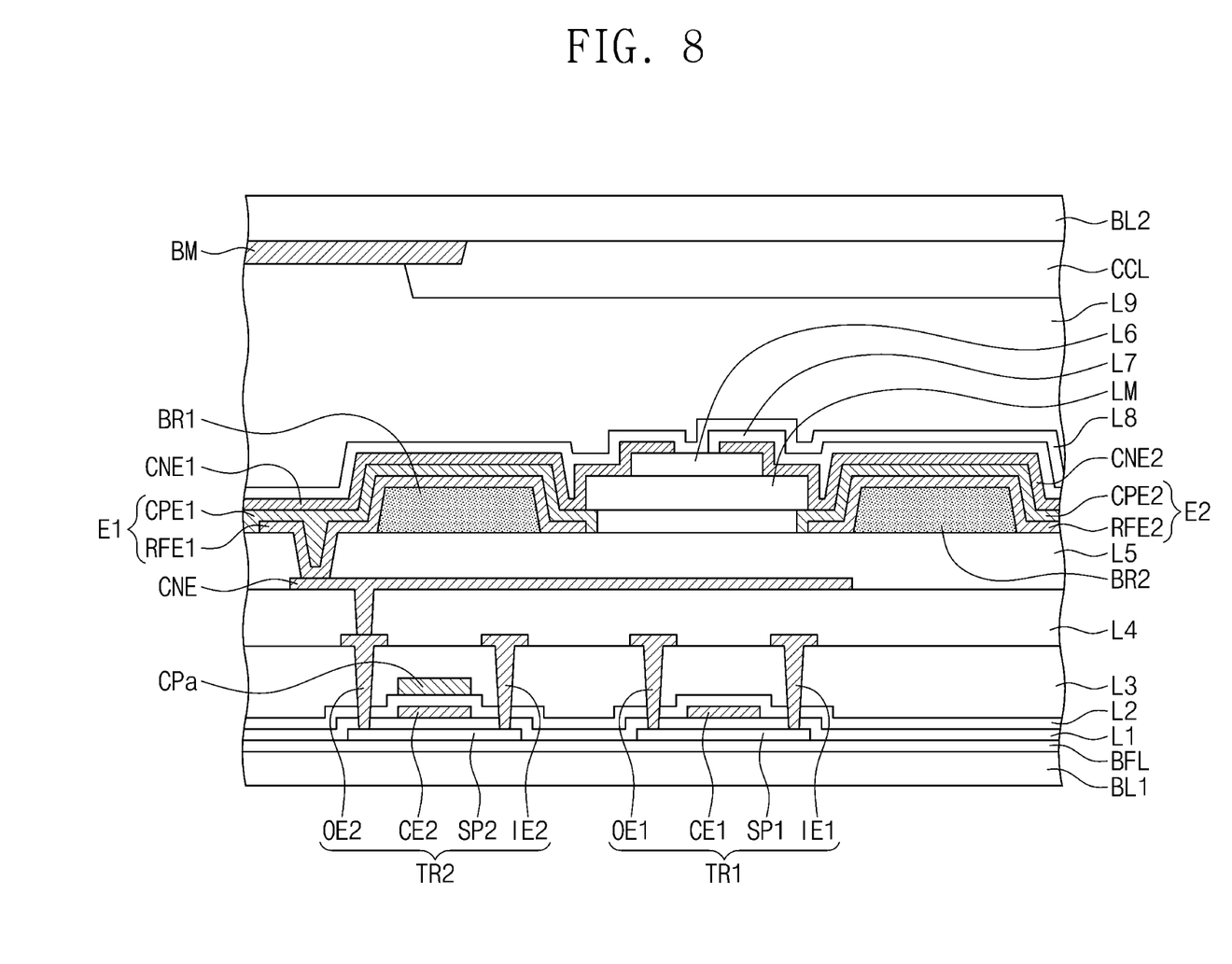
FIG. 8 is an enlarged cross-sectional view showing an embodiment of a light emitting module.

FIG. 8 is an enlarged cross-sectional view of an embodiment of a light emitting module among the light emitting modules EM1, EM2, EM3, and EM4. In an embodiment, for example, the light emitting modules EM1 to EM4 include micro-LEDs as shown in FIG. 8.

A first base layer BL1 and a second base layer BL2 may face each other. Each of the first and second base layers BL1 and BL2 may be a silicon substrate, a plastic substrate, a glass substrate, a dielectric film, or a stack structure including a plurality of dielectric layers.

A buffer layer BFL may be disposed on the first base layer BL1. The buffer layer BFL may be provided thereon with a first thin film transistor TR1 and a second thin film transistor TR2.

The first thin film transistor TR1 may include a first control electrode CE1, a first input electrode IE1, a first output electrode OE1, and a first semiconductor pattern SP1. The second thin film transistor TR2 may include a second control electrode CE2, a second input electrode 1E2, a second output electrode OE2, and a second semiconductor pattern SP2.

The first and second semiconductor patterns SP1 and SP2 may be disposed on the buffer layer BFL. The buffer layer BFL may reduce or effectively prevent the first and second semiconductor patterns SP1 and SP2 from receiving pollutants and moisture from or through the first base layer BL1.

The buffer layer BFL may be provided thereon with a first dielectric layer L1 covering the first and second semiconductor patterns SP1 and SP2. The first dielectric layer L1 may include an inorganic material or organic material.

The first and second control electrodes CE1 and CE2 may be disposed on the first dielectric layer L1. The first dielectric layer L1 may be provided thereon with a second dielectric layer L2 covering the first and second control electrodes CE1 and CE2. The second dielectric layer L2 may include an inorganic material or organic material.

A second cap electrode CPa may be disposed on the second dielectric layer L2. The second cap electrode CPa together with another electrode may constitute a capacitor.

The second dielectric layer L2 may be provided thereon with a third dielectric layer L3 covering the second cap electrode CPa. The third dielectric layer L3 may be provided thereon with the first input electrode IE1, the first output electrode OE1, the second input electrode 1E2, and the second output electrode OE2. The first input electrode IE1 and the first output electrode OE1 may be connected to the first semiconductor pattern SP1 through or at perforation holes which penetrate the first, second, and third dielectric layers L1, L2, and L3. The second input electrode 1E2 and the second output electrode OE2 may be connected to the second semiconductor pattern SP2 through or at perforation holes which penetrate the first, second, and third dielectric layers L1, L2, and L3.

The third dielectric layer L3 may be provided thereon with a fourth dielectric layer L4 covering the first input electrode IE1 the first output electrode OE1, the second input electrode 1E2, and the second output electrode OE2.

A connecting electrode CNE may be disposed on the fourth dielectric layer L4. The connecting electrode CNE may be connected to the second output electrode OE2.

The fourth dielectric layer L4 may be provided thereon with a fifth dielectric layer L5 covering the connecting electrode CNE. The fifth dielectric layer L5 may include an organic material. The fifth dielectric layer L5 may provide a planarized surface.

The fifth dielectric layer L5 may be provided thereon with a first partition wall BR1 and a second partition wall BR2. The first partition wall BR1 and the second partition wall BR2 may be spaced apart from each other along the first base layer BL1, to define an opening therebetween.

A first electrode E1 may be disposed on the first partition wall BR1, and a second electrode E2 may be disposed on the second partition wall BR2. The first electrode E1 may cover the first partition wall BR1, and the second electrode E2 may cover the second partition wall BR2.

The fifth dielectric layer L5 may be provided therein with a perforation hole, and the connecting electrode CNE may be exposed at the perforation hole to outside the fifth dielectric layer L5. The first electrode E1 may be electrically connected to the connecting electrode CNE which is exposed, at the perforation hole in the fifth dielectric layer L5.

The first electrode E1 may include a first reflective electrode RFE1 and a first capping electrode CPE1, and the second electrode E2 may include a second reflective electrode RFE2 and a second capping electrode CPE2.

Each of the first and second reflective electrodes RFE1 and RFE2 may include a reflective material. In an embodiment, for example, each of the first and second reflective electrodes RFE1 and RFE2 may include one or more of indium tin oxide ("ITO"), silver (Ag), and aluminum (Al).

The first capping electrode CPE1 may cover the first reflective electrode RFE1, and the second capping electrode CPE2 may cover the second reflective electrode RFE2. In an embodiment, for example, each of the first and second capping electrodes CPE1 and CPE2 may include one or more of indium zinc oxide ("IZO"), indium tin oxide ("ITO"), indium gallium oxide ("IGO"), indium gallium zinc oxide ("IGZO"), and a combination thereof.

A light emitting device LM may be disposed on the fifth dielectric layer L5. The light emitting device LM may be electrically connected to the first and second electrodes E1 and E2 at the opening between the first partition wall BR1 and the second partition wall BR2 spaced apart from each other.

A sixth dielectric layer L6 may be disposed on the light emitting device LM. The sixth dielectric layer L6 may cover at least a portion of a top surface of the light emitting device LM. A portion of the top surface of the light emitting device LM may be exposed outside of the sixth dielectric layer L6, such as at ends of the light emitting device LM.

The light emitting device LM may be electrically connected to the first electrode E1 through a first connection electrode CNE1, and may also be electrically connected to the second electrode E2 through a second connection electrode CNE2.

The second connection electrode CNE2 may be disposed on the light emitting device LM and the second electrode E2. A seventh dielectric layer L7 may be disposed on the second connection electrode CNE2. The first connection electrode CNE1 may be disposed on the light emitting device LM and the first electrode E1.

An eighth dielectric layer L8 may be disposed on the first connection electrode CNE1 and the seventh dielectric layer L7 on the second connection electrode CNE2. The eighth dielectric layer L8 may be an encapsulation layer.

The second base layer BL2 may be provided with a light-shield layer BM on a surface of the second base layer BL2 which faces the first base layer BL1. The light-shield layer BM may defined or be provided with an opening at which a wavelength conversion member CCL is disposed.

The wavelength conversion member CCL may include illuminants. In an embodiment, for example, the illuminants may adsorb a first light provided from the light emitting device LM, and may convert a wavelength of the first light into a second light having a color different from a color of the first light. The second light may be emitted from the illuminants from the wavelength conversion member CCL. The illuminants may be, for example, quantum dots. In other embodiment, the wavelength conversion member CCL may be omitted.

A ninth dielectric layer L9 may be disposed between the wavelength conversion member CCL and the eighth dielectric layer L8. In an embodiment, for example, the ninth dielectric layer L9 may be an optically clear adhesive film, an optically clear resin, or a pressure sensitive adhesive film. In other embodiments, the ninth dielectric layer L9 may be omitted.

According to one or more embodiment of the invention, a display apparatus may emit light from a corner portion thereof, in addition to emitting light and/or displaying an image at non-corner portions thereof. Therefore, the display apparatus may have an improved aesthetic appearance from an environment external to the display apparatus. In addition, the corner portion of the display apparatus may be utilized as a display area in addition to non-corner portions thereof, and thus the display apparatus may have a relatively wide display area.

Although the invention is described in conjunction with embodiments thereof, it would be understood by those skilled in the art that the invention can be modified or changed in various ways without departing from spirit and scope of the invention defined by the appended claims. Further, the embodiments disclosed herein are not intended to limit the technical spirit of the invention, and all technical spirit within the claims and their equivalents should be construed as being included in the invention.

What is claimed is:

1. A display apparatus, comprising:
a display module which displays an image;
a window member through which the image is transmitted to outside the display apparatus, wherein the window member includes:
a first transmission portion including a first side, a second side extending from the first side, a first corner at which the first side and the second side meet, a third side extending from the second side and parallel to the first side, and a fourth side extending from the third side and parallel to the second side;
a second transmission portion extending curved along a thickness direction of the display apparatus from the first side of the first transmission portion;
a third transmission portion extending curved along the thickness direction of the display apparatus from the second side of the first transmission portion; and
a first corner transmission portion extending curved along the thickness direction of the display apparatus from the first corner of the first transmission portion, the first corner transmission portion between the second transmission portion and the third transmission portion; and
a support member disposed below the display module and comprising a bottom portion, a side portion extending from the bottom portion to the first transmission portion, and a top portion extending parallel to the bottom portion from the side portion,
wherein
the display module includes:
a display panel overlapping the first transmission portion, the second transmission portion and the third transmission portion of the window member, and
a first light emitting module overlapping the first corner transmission portion of the window member,
a first portion of the display panel and a gap between the first light emitting module and the display panel overlap the top portion of the support member, and
a second portion of the display panel which is adjacent to the first portion of the display panel does not overlap the top portion of the support member.

2. The display apparatus of claim 1, wherein the window member further includes:
a fourth transmission portion extending curved along the thickness direction of the display apparatus from the third side of the first transmission portion;
a fifth transmission portion extending curved along the thickness direction of the display apparatus from the fourth side of the first transmission portion;
a second corner transmission portion extending curved along the thickness direction of the display apparatus from a second corner of the first transmission portion at which the second side and the third side meet, the second corner transmission portion between the third transmission portion and the fourth transmission portion;
a third corner transmission portion extending curved along the thickness direction of the display apparatus from a third corner of the first transmission portion at which the third side and the fourth side meet, the third corner transmission portion between the fourth transmission portion and the fifth transmission portion; and
a fourth corner transmission portion extending curved along the thickness direction of the display apparatus from a fourth corner of the first transmission portion at which the fourth side and the first side meet, the fourth corner transmission portion between the second transmission portion and the fifth transmission portion.

3. The display apparatus of claim 2, wherein the display module further includes:
an input detection sensor with which an external touch is detected,
the display panel disposed further corresponding to each of the fourth transmission portion and the fifth transmission portion of the window member;
a second light emitting module corresponding to the second corner transmission portion of the window member;
a third light emitting module corresponding to the third corner transmission portion of the window member; and
a fourth light emitting module corresponding to the fourth corner transmission portion of the window member,
wherein the input detection sensor overlaps the display panel and does not overlap the first light emitting module, the second light emitting module, the third light emitting module, and the fourth light emitting module.

4. The display apparatus of claim 1, wherein
the display panel includes a first light emitting device including an organic material, and
the first light emitting module includes a second light emitting device different from the first light emitting device.

5. The display apparatus of claim 4, wherein
the first light emitting device of the display panel is an organic light emitting device, and
the second light emitting device of the first light emitting module is a micro-light emitting diode.

6. The display apparatus of claim 1, wherein the support member faces the window member with both the display panel and the first light emitting module therebetween.

7. The display apparatus of claim 1, wherein the display module further includes:
a first data driver circuit which provides a first data signal to the display panel;
a second data driver circuit which provides a second data signal to the first light emitting module; and
a control circuit which controls the first data driver circuit and the second data driver circuit.

8. The display apparatus of claim 7, wherein the control circuit determines colors of light emitted from the display panel and the first light emitting module, respectively, and controls the first data driver circuit to output the first data signal and the second data driver circuit to output the second data signal based on the determined colors.

9. The display apparatus of claim 1, wherein within the display module,
the first light emitting module corresponding to the first corner transmission portion of the window member emits a light having a first color, and
an area of the display panel is disposed adjacent to the first light emitting module and emits a light having a color substantially the same as the first color.

10. The display apparatus of claim 1, wherein at the first corner transmission portion of the window member, the first light emitting module includes a first sub-light emitting module and a second sub-light emitting module which are spaced apart from each other and each providing light at the first corner portion.

11. A display apparatus, comprising:
a window member;
a display module disposed below the window member and including a display panel and a light emitting module; and
a support member disposed below the display module and comprising a top portion, a side portion bending from the top portion and extending along a thickness direction of the display apparatus, and a bottom portion extending parallel to the top portion from the side portion,
wherein
the display module further includes:
a first display area including a first side, a second side extending from the first side, a first corner at which the first side and the second side meet, a third side extending from the second side and parallel to the first side, and a fourth side extending from the third side and parallel to the second side;
a second display area extending curved along the thickness direction of the display apparatus from the first side of the first display area;
a third display area extending curved along the thickness direction of the display apparatus from the second side of the first display area; and
a first sub-display area extending curved along the thickness direction of the display apparatus from the first corner of the first display area, the first sub-display area between the second display area and the third display area,
the display panel corresponds to the first display area, the second display area and the third display area,
the light emitting module corresponds to the first sub-display area,
a first portion of the display panel and a gap between the light emitting module and the display panel overlap the top portion of the support member, and
a second portion of the display panel which is adjacent to the first portion of the display panel does not overlap the top portion of the support.

12. The display apparatus of claim 11, wherein the display module further includes:
a fourth display area extending curved along the thickness direction of the display apparatus from the third side of the first display area;
a fifth display area extending curved along the thickness direction of the display apparatus from the fourth side of the first display area;
a second sub-display area extending curved along the thickness direction of the display apparatus from a second corner of the first display area at which the second side and the third side meet, the second sub-display area between the third display area and the fourth display area;
a third sub-display area extending curved along the thickness direction of the display apparatus from a third corner of the first display area at which the third side and the fourth side meet, the third sub-display area between the fourth display area and the fifth display area; and
a fourth sub-display area extending curved along the thickness direction of the display apparatus from a fourth corner of the first display area at which the fourth side and the first side meet, the fourth sub-display area between the second display area and the fifth display area.

13. The display apparatus of claim 12, wherein the display module further includes:
a bezel area adjacent to the second display area, the third display area, and the first sub-display area,
a first boundary defined between the first sub-display area and the second display area and between the first sub-display area and the third display area, the first boundary having a constant color that is the same as or similar to the color of the bezel area,
a second boundary defined between the second sub-display area and the third display area and between the second sub-display area and the fourth display area, the second boundary having a constant color;
a third boundary defined between the third sub-display area and the fourth display area and between the third sub-display area and the fifth display area, the third boundary having a constant color; and
a fourth boundary between the fourth sub-display area and the second display area and between the fourth sub-display area and the fifth display area, the fourth boundary having a constant color,
wherein colors of the bezel area, the first boundary, the second boundary, the third boundary, and the fourth boundary are substantially same each other.

14. The display apparatus of claim 11, wherein the light emitting module includes a first sub-light emitting module and a second sub-light emitting module spaced apart from each other.

15. The display apparatus of claim 11, wherein
the display panel includes a first light emitting device including an organic material, and
the light emitting module includes a second light emitting device including a semiconductor material.

* * * * *